June 10, 1958 G. L. FERNSLER ET AL 2,838,673

WIDE-RANGE CAPTIVE OSCILLATOR SYSTEM

Filed Sept. 23, 1954

INVENTOR.
GEORGE L. FERNSLER AND
KENNETH G. MACLEAN
BY F. A. Reckif
AGENT

United States Patent Office 2,838,673

Patented June 10, 1958

2,838,673

WIDE-RANGE CAPTIVE OSCILLATOR SYSTEM

George L. Fernsler, Pennington, and Kenneth G. MacLean, Princeton, N. J., assignors, by mesne assignments, to the United States of America as represented by the Secretary of the Navy Application September 23, 1954, Serial No. 457,984

14 Claims. (Cl. 250—36)

Figure 1:
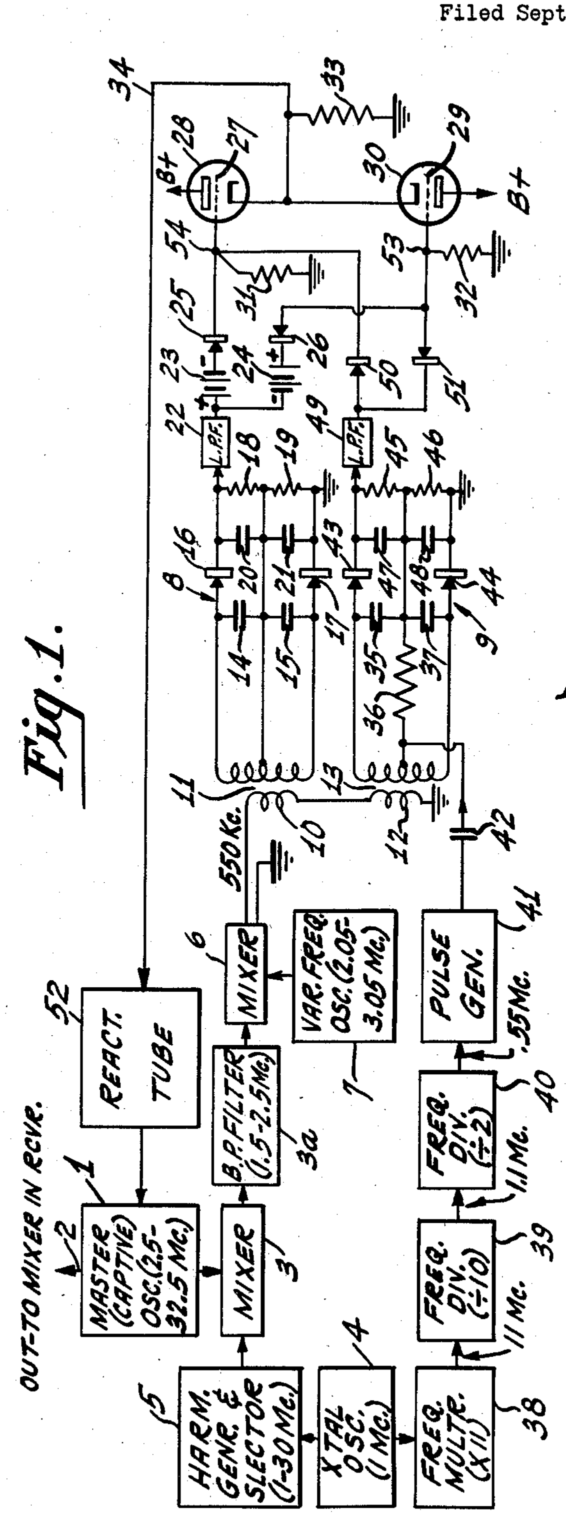

This invention relates to a frequency control system, and more particularly to a system for stabilizing the frequency of a captive oscillator at any one of a multiplicity of frequencies over a wide frequency range.

For many types of equipment requiring high frequency stability oscillators, it is necessary to employ an oscillator which is variable (tunable) over a very wide range of frequencies, yet which is extremely stable at any one particular frequency setting. Such an oscillator has been provided by utilizing what is known as a frequency synthesizer or a captive oscillator system, in which a variable frequency master oscillator is locked in frequency to a crystal oscillator standard by a frequency control system of one type or another. Frequency control systems have employed a tuned frequency discriminator or alternatively a phase detector in the frequency correction network for the captive oscillator.

An oscillator frequency control system using a tuned frequency discriminator has the disadvantage that, even when a stable frequency control point has been reached, a small residual D.-C. voltage exists in the output of the discriminator, which means that there is an error with respect to the frequency standard. This comes about because of the following. In the event of a disturbance in the frequency of the controlled oscillator, a voltage is produced in the discriminator output which tends to bring the oscillator back to the correct frequency and this voltage is applied to the frequency controlling means for the oscillator (e. g., a reactance tube). However, this voltage must be continually present and acting on the frequency controlling means. To develop this voltage in the discriminator output requires that the input signal to the discriminator be different from the discriminator center frequency. There is thus a residual frequency error between the controlled oscillator frequency and the frequency standard or discriminator center frequency.

According to the present invention, a balanced phase detector is used in combination with a frequency discriminator for the final frequency control of the controlled oscillator, the outputs of both these units being for example combined and applied to the reactance tube. However, even with this arrangement a small residual voltage will always exist due to the discriminator. This will introduce a small error in the phase of the controlled oscillator relative to the crystal standard. On the other hand, this does not introduce an error in frequency, as it would if a discriminator alone were used; the main effect of this residual voltage is to reduce the range of control of the phase detector. Thus, the disadvantage described in the preceding paragraph is rendered less serious.

Further according to this invention, however, even this phase error is effectively eliminated by providing a diode switching arrangement which removes the frequency discriminator entirely from the circuit when final control of the oscillator is being achieved.

Therefore, an object of this invention is to provide a frequency control system which utilizes a frequency discriminator for wide frequency lock-in range and yet which eliminates the residual error which would otherwise result from the use of such discriminator.

Another object is to devise a novel type of frequency control system utilizing both a frequency discriminator and a phase detector.

A further object is to devise a novel type of frequency control system for stabilizing the frequency of an oscillator at any one of a multiplicity of frequencies throughout a wide frequency range.

The objects of this invention are accomplished, briefly, in the following manner: A portion of the output of a captive or master oscillator to be stabilized is mixed with a selected crystal-derived harmonic frequency to produce a first beat frequency which is in turn mixed with the output of a variable frequency source to produce a second beat frequency of predetermined nominal value. This second beat frequency is applied to a tuned frequency discriminator having a wide pull-in range and also to a balanced phase detector, to the latter of which are also applied for comparison purposes, pulses of stable frequency of the said nominal value; a common connection extends from the outputs of the frequency discriminator and the phase detector to a reactance tube for controlling the master oscillator frequency. A biased switching arrangement is provided between the frequency discriminator output and the common connection, to effectively remove this discriminator from the control circuit when its output is less than a predetermined value.

Figure 2:
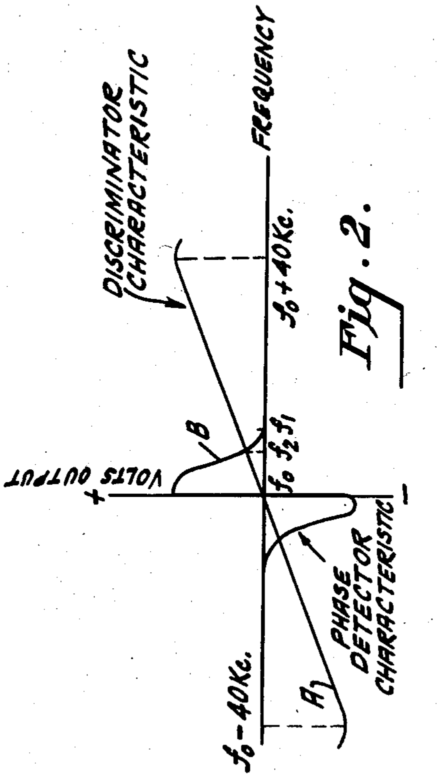

The foregoing and other objects of the invention will be better understood from the following description of an exemplification thereof, reference being had to the accompanying drawing, wherein:

Fig. 1 is a combination block diagram and detailed schematic of an arrangement according to this invention; and Fig. 2 is a set of curves useful in explaining the operation of the invention.

Referring now to Fig. 1, a master (captive) oscillator 1 is the oscillator that is to be stabilized in frequency by the control arrangement of this invention, at any one frequency throughout a wide frequency range, on the order of 2.5 to 32.5 mc., for example. The oscillator 1 may for example be conveniently used as the heterodyne oscillator in a communications receiver, and for this purpose oscillatory energy output is taken from oscillator 1 by means of a connection 2 and is fed to a mixer in the receiver. A typical receiver in which the oscillator 1 may be employed is illustrated in the copending application, Serial No. 381,315, filed September 21, 1953. The oscillator 1 is tunable by a suitable bandswitching means (not shown) to any one of a plurality of frequency bands, and is also variable in frequency over each band by a manually-operated tuning means.

In order to lock the frequency of the oscillator 1 to a stable frequency, such as the output of a crystal-controlled source, a portion of the output of oscillator 1 is fed to a mixer 3 for heterodyning or mixing purposes. A crystal oscillator 4, operating for example at a frequency of one mc., feeds energy of this frequency into a harmonic generator and selector 5, which functions to generate harmonics of the 1-mc. fundamental frequency input thereto, adjacent harmonics being of course spaced apart in frequency by one mc. Any particular 1-mc. harmonic frequency wave, in the range of 1–30 mc., may be selected in unit 5, the particular crystal-stabilized harmonic frequency selected appearing at the output of unit 5 which is coupled to mixer 3. A typical harmonic frequency generator and selector which may be used at 5 is illustrated in the copending application, Serial No. 423,725, filed April 16, 1954, now Patent No. 2,742,572, issued April 17, 1956.

In mixer 3, the output of oscillator 1 is mixed with the output of unit 5 to produce a first beat frequency wave lying in the range of 1.5 to 2.5 mc., and the beat frequency in this range (the difference between the frequencies of 1 and 5) is selected at the output of mixer 3 by bandpass filter 3*a*, and passed on to another mixer 6. The beat frequency output of mixer 3 is representative of the frequency of oscillator 1. A variable-frequency source 7, which is quite stable in frequency, also feeds oscillatory energy into mixer 6. Oscillator 7 for example, may be tunable over a 1-mc. range (from 2.05 to 3.05 mc.), this range being equal to the frequency of oscillator 4 and to the spacing between adjacent harmonics in harmonic generator 5.

In mixer 6, the output of oscillator 7 is mixed with the first beat frequency output of mixer 3 to produce a second beat frequency wave (the difference between the output frequencies of 7 and 3) having a nominal value of 550 kc., or 0.55 mc.

The 550-kc. (nominal) output of mixer 6 is fed to two frequency-sensitive or frequency-responsive circuits, one being a tuned frequency discriminator-detector 8 and the other being a phase detector 9. More in detail, the output of mixer 6 is fed to the primary winding 10 of a first transformer 11 and also to the primary winding 12 of a second transformer 13. A capacitor 14 is connected across half of the secondary winding of transformer 11 and a capacitor 15 is connected across the other half of such secondary winding, thereby to tune the respective secondary winding portions. One secondary winding portion is tuned to one side of the 550-kc. center frequency while the other secondary winding portion is tuned to the opposite side of said center frequency. For the frequency discriminator-detector 8, diode detectors are provided, these for example being of the 1N34 crystal type. The diodes are connected similarly to opposite ends of the secondary of transformer 11, the anode of diode 16 being connected to one end of this secondary and the anode of diode 17 being connected to the other end of such secondary. The cathode of diode 16 is connected to one free end of a pair of serially-connected load resistors 18 and 19 the other free end of which is grounded, while the cathode of diode 17 is grounded. A filter capacitor 20 is connected in parallel with resistor 18, and a filter capacitor 21 is connected in parallel with resistor 19. The common junction point of resistors 18 and 19 and capacitors 20 and 21 is connected to the midpoint of the secondary winding of transformer 11. Output from the frequency discriminator-detector 8 is taken off from the cathode of diode 16 and applied to the input side of a low pass filter 22.

The frequency discriminator-detector 8 has a center frequency of 550 kc., the nominal value of the second beat frequency, and this discriminator functions in a more or less well-known manner to develop a D.-C. output voltage proportional to deviations of the second beat frequency wave output of mixer 6 from the said nominal value. This D.-C. output voltage appears at the cathode of diode 16 and is positive or negative with respect to ground depending upon the sense of the frequency deviation of the mixer 6 output with respect to 550 kc., the magnitude of such D.-C. output voltage depending on the actual amount of frequency difference, in cycles per second, between the mixer 6 output and 550 kc. This D.-C. output voltage is filtered by filter 22 and may appear as either a positive or a negative voltage at the output of this filter.

A biased-diode switching arrangement is connected to the output of filter 22, this arrangement consisting of batteries 23 and 24 and diodes 25 and 26. The diodes 25 and 26 may also be of the 1N34 crystal type, while the batteries 3 and 24 may be of the so-called mercury cell type, having a nominal voltage of about one volt. The positive terminal of battery 23 is connected to the output of low pass filter 22 and the negative terminal of this battery is connected to the anode of diode 25. The cathode of diode 25 is connected to the grid 27 of a cathode follower vacuum tube 28. Thus, the anode of diode 25 is biased negatively, and any positive voltage at the output of filter 22 which has an amplitude sufficient to overcome the bias of battery 23 will pass through diode 25 and be applied to grid 27. Positive voltages of lesser amplitude do not overcome battery 23 and thus do not pass through diode 25.

A similar biased diode arrangement is provided for negative voltages at the output of filter 22. The negative terminal of battery 24 is connected to the output of low pass filter 22 and the positive terminal of this battery is connected to the cathode of diode 26. The anode of diode 26 is connected to the grid 29 of a cathode follower vacuum tube 30. Thus, the cathode of diode 26 is biased positively, and any negative voltage at the output of filter 22 which has an amplitude sufficient to overcome the bias of battery 24 will pass through diode 26 and be applied to grid 29. Negative voltages of lesser amplitude do not overcome battery 24 and thus do not pass through diode 26.

A resistor 31 is connected from grid 27 to ground, while a resistor 32 is connected from grid 29 to ground. The cathode of the device 28 and the cathode of the device 30 are connected together through a common cathode resistor 33 to ground, to provide a common cathode follower output connection 34 connected to the two cathodes. The anodes of devices 28 and 30 are connected to the positive terminal B+ of a suitable source of unidirectional potential.

For the balanced phase detector 9, a capacitor 35 is connected from one end of the secondary winding of transformer 13 through a resistor 36 to the midpoint of such secondary winding, and a capacitor 37 is connected between the other end of such secondary winding and the common junction of capacitor 35 and resistor 36.

In order to supply a stable 550-kc. reference frequency wave to phase detector 9 for comparison purposes, a portion of the output of crystal oscillator 4 is fed to a frequency multiplier 38 having a multiplication factor of 11, to derive a stable 11-mc. wave which is fed to a frequency divider 39 having a division factor of 10. The 1.1-mc. output of divider 39 is fed to another frequency divider 40 having a division factor of 2, to produce a stable .55-mc. reference frequency wave. The output of divider 40 is substantially sinusoidal, and this output is fed to a pulse generator 41 of well-known type, which functions to provide as its output a series of short pulses, one pulse for each cycle of the sinusoidal input wave thereto. The output of pulse generator 41 is fed through a coupling capacitor 42 to the midpoint of the secondary winding of transformer 13 in the phase detector 9. Thus, the stable reference frequency input for phase detector 9 consists of a series of pulses occurring at a stable repetition rate of 550,000 pulses per second. The controlled frequency applied to phase detector 9 is obtained by way of transformer winding 12 from the output of mixer 6, in the manner previously described.

Again for the phase detector 9, diode detectors are utilized, and these may be of the 1N34 crystal type. The anode of diode 43 is connected to one end of the secondary of transformer 13 and the anode of diode 44 is connected to the other end of such secondary. The cathode of diode 43 is connected to one free end of a pair of serially-connected load resistors 45 and 46 the other free end of which is grounded, while the cathode of diode 44 is grounded. A filter capacitor 47 is connected in parallel with resistor 45, and a filter capacitor 48 is connected in parallel with resistor 46. The common junction point of resistors 45 and 46 and capacitors 47 and 48 is connected by way of resistor 36 to the midpoint of the secondary winding of transformer 13. Output from the phase detector 9 is taken off from the cathode of diode 43 and applied to the input side of a low pass filter 49.

The phase detector 9 described has two inputs, one from pulse generator 41 and the other from mixer 6, and functions to develop a D.-C. output voltage proportional to phase differences between the two inputs thereto, one input being the stable frequency pulses coming from generator 41 and the other being the wave output of mixer 6, nominally at 550 kc. but which will vary directly with any frequency change at oscillator 1. This D.-C. output voltage appears at the cathode of diode 43 and is positive or negative with respect to ground depending upon the sense of the phase deviation of the mixer 6 output with respect to the pulses out of generator 41, the magnitude of such D.-C. output depending on the actual amount of phase difference between the mixer 6 output and the pulses out of generator 41. This D.-C. output voltage is filtered by filter 49 and may appear as either a positive or a negative voltage at the output of this filter.

A diode arrangement is connected to the output of filter 49, for a purpose that will appear hereinafter. The diodes 50 and 51 may also be of the 1N34 crystal type. The anode of diode 50 is connected to the output of filter 49, while the cathode of this diode is connected to grid 27. Thus, positive voltages appearing at the output of filter 49 pass through diode 50 and are applied to grid 27. The cathode of diode 51 is connected to the output of filter 49, while the anode of this diode is connected to grid 29. In this way, negative voltages appearing at the output of filter 49 pass through diode 51 and are applied to grid 29.

Diode 50 and diode 25 have like polarities at their common connection (point 54) to grid 27. Likewise, diode 51 and diode 26 have like polarities at their common connection to grid 29, point 53. Thus, diodes 50 and 25 act in a manner similar to common diodes in diversity receiver practice. That is, when one diode produces an output voltage higher than the other the diode of lower output is biased off. Diodes 51 and 26 also act so as to bias off one or the other depending on which one has the higher output. Thus, diodes 25 and 50 act as an automatic selector for positive voltage outputs from discriminator 8 and phase detector 9, and diodes 26 and 51 act as a similar automatic selector for negative voltage outputs from discriminator 8 and phase detector 9.

The common cathode follower output connection 34 is coupled to a reactance tube 52 which is in turn coupled to the oscillator 1 for controlling or varying the frequency of said oscillator. In this way, the outputs of both the frequency discriminator 8 and the phase detector 9 may be applied to the reactance tube to control the frequency of oscillator 1.

Fig. 2 is a set of curves in which curve A represents the input frequency-volts output characteristic of frequency discriminator 8 and curve B represents the similar characteristic of phase detector 9. The discriminator 8 has a rather large pull-in range, for example ±40 kc. as illustrated in Fig. 2, curve A. Curve B shows that the phase detector 9 operates only over a narrow frequency range. Let us for the moment neglect the diodes 25, 26, 50 and 51, that is, let us assume that these diodes as well as the batteries 23 and 24, are not present in the circuit. When a new master oscillator frequency is desired, oscillator 1 is tuned to the vicinity of such new frequency by means of the manual tuning instrumentalities (not shown) associated therewith, including the bandswitches and the within-band tuning devices. Also, the proper harmonic frequency is selected in unit 5, and the proper frequency is selected by the tuning of oscillator 7. Then, assuming a pull-in of the oscillator 1 by the discriminator 8 at $f_0$+40 kc., as illustrated in Fig. 2, the discriminator 8 acts to cause the frequency of oscillator 1 to be such that the frequency out of mixer 6 approaches the frequency $f_0$, the center frequency of this discriminator, 550 kc. As the oscillator approaches the desired frequency the voltage output from discriminator 8 approaches zero, as shown by curve A. A point $f_1$ will be reached at which the phase detector 9 begins to generate an output voltage which soon (at point $f_2$) exceeds the discriminator output. As these two outputs are connected to the same grid 27 (or, alternatively, to grid 29), they will both contribute to stabilizing or locking-in the oscillator 1. As the phase detector 9 compares the phase of the sine wave output voltage of mixer 6 with pulses derived from the crystal 4 by way of pulse generator 41, the oscillator 1 is finally locked in frequency to the exact frequency desired, a frequency such that the output of mixer 6 is at a frequency exactly $f_0$ or 550 kc. In other words, according to this invention the frequency discriminator 8 causes the master oscillator 1 to be tuned to approximately the desired frequency, over a pull-in range of say 40 kc. The phase detector 9 then assumes control and locks the master oscillator to the standard, with only a phase disparity.

If the frequency control and stabilization system used only the frequency discriminator 8, without the phase detector 9, a residual error in the frequency of oscillator 1, with respect to the desired frequency, would exist, due to the small residual D.-C. voltage which exists in the output of the discriminator. However, with the use of the phase detector 9 in addition, an accurate frequency relation between the master oscillator and reference frequencies is achieved, with no error in frequency due to the discriminator. This can be explained in the following way. Assuming a pull-in of the oscillator 1 from a point 40 kc. removed from the desired frequency, as the oscillator approaches a frequency proportional to $f_0$ the discriminator voltage approaches zero and the phase detector starts to deliver output. With the common connection of the discriminator and phase detector outputs (it being remembered that it is still being assumed that diodes 25, 26, 50 and 51 and batteries 23 and 24 are not present in the circuit) a small voltage will always exist due to the discriminator. This will introduce a small error in the phase of the oscillator 1 relative to the crystal standard. However, this does not introduce an error in frequency, because of the presence of the phase detector 9. The main effect of this error is to reduce the range of control of the phase detector by offsetting such range slightly (to one side or the other) from what it would normally be.

This phase error is eliminated according to the invention as illustrated in Fig. 1 by the provision of the biased and unbiased diodes, the action of which will now be explained. The diodes provide automatic switching of the control between the frequency discriminator 8 and the phase detector 9.

If it is assumed that the master oscillator 1 is off from the desired frequency by say 20 kc., a voltage is established at the output of filter 22 that is sufficient to override the battery bias potential on one or the other of the diodes 25 or 26, the particular bias overridden depending upon the polarity of the discriminator output voltage, in turn depending upon in which direction the oscillator 1 is off. The circuit will then be completed for establishing the D.-C. correction voltage (output of frequency discriminator 8) through the cathode followers 28 or 30 to the reactance tube 52 for varying the frequency of the master oscillator. As the master oscillator approaches the correct frequency, the phase detector 9 begins to supply a D.-C. correction voltage (curve B) which is applied also to grid 27 or grid 29, depending upon its polarity. As the oscillator 1 approaches the correct frequency, the frequency discriminator output voltage decreases, as shown by curve A. As this voltage decreases, a point is reached where this voltage is less than the bias voltage provided by the batteries 23 and 24. The diodes 25 and 26 then do not conduct, opening the circuit between the output of filter 22 and the tubes 28 and 30, removing the frequency discriminator from the circuit and switching the control from the frequency discriminator to the phase detector. In other words, from this point the phase detector alone supplies the correction voltage to the reactance tube 52.

According to this invention, the appropriate source of correction voltage is automatically selected, depending upon the frequency departure of the master oscillator 1 from the correct, desired frequency. Also, this invention results in maximum sensitivity of the phase detector, due to removing from the circuit the undesired residual bias coming from the frequency discriminator (by effectively removing this discriminator from the circuit) when the oscillator frequency has been brought within the range of control of the phase detector. Thus, the residual voltage from the frequency discriminator does not need to be overcome by the phase detector, since such voltage is in effect removed from the circuit when the frequency error of oscillator 1 is such as to provide greater output from the phase detector than from the frequency discriminator, at which time the frequency discriminator output is insufficient to overcome the bias potential provided by batteries 23 and 24. Also, when correction by the phase detector 9 is complete, the residual voltage from the discriminator 8 is thus in effect removed by the bias batteries 23 and 24.

In addition to the action of the biasing batteries 23 and 24 for effectively disconnecting the frequency discriminator from the circuit under certain conditions, the common connection of diodes 25, 50 and 26, 51 at points 54 and 53, respectively (which points are located at the grids 27 and 29, respectively), has a further desired result in selecting for use the frequency discriminator or the phase detector output. This has been referred to previously but will now be explained in more detail. This result comes about because of the following. When the master oscillator frequency error is large, the voltage from the frequency discriminator (represented by curve A) is greater than that from the phase detector (represented by curve B). Consequently, diode 25 or diode 26 will be conductive and the resultant D.-C. voltage at 54 or 53 is such as to cut off 50 or 51, disconnecting the phase detector 9 from reactance tube 52. For example, if the frequency discriminator output voltage is positive, diode 25 conducts to establish a positive potential at point 54 which puts a positive bias on the cathode of diode 50, cutting off such latter diode. If the frequency discriminator output voltage is negative, diode 26 conducts to establish a negative potential at point 53 which puts a negative bias on the anode of diode 51, cutting off such latter diode.

When the master oscillator frequency approaches the desired frequency (such that the output frequency out of mixer 6 is for example between $f_2$ and $f_0$ in Fig. 2), the phase detector output voltage is greater than the frequency discriminator output voltage. Then, diode 50 or diode 51 will be conductive and the resulting D.-C. voltage at 54 or 53 is such as to cut off 25 or 26, thus disconnecting the frequency discriminator 8 from the reactance tube 52. For example, if the phase detector output voltage is positive, diode 50 conducts to establish a positive potential at point 54 which puts a positive bias on the cathode of diode 25, cutting off such latter diode. If the phase detector output voltage is negative, diode 51 conducts to establish a negative potential at point 53 which puts a negative bias on the anode of diode 26, cutting off such latter diode.

Although crystal diodes have been mentioned at 16, 17, 25, 26, 43, 44, 50 and 51, vacuum tube diodes could be used at some or all of these locations. It should be noted that a variable frequency interpolation oscillator 7 is used in the example, permitting continuous frequency coverage with the master oscillator 1. The frequency stability of the system in Fig. 1 depends only upon the stability of the crystal standard 4 and of the variable frequency oscillator 7.

For greater frequency stability, the variable frequency oscillator 7 might be replaced by a source of selected frequencies, derived for example from various crystals which could be selectively switched into an oscillator circuit to provide stepwise rather than continuous tuning for oscillator 7. In this case, of course, stepwise rather than continuous frequency variation of oscillator 1 would be had.

What is claimed is:

1. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal walue to said phase detector as the other input therefor, a common output circuit receptive of both of said output voltages for controlling the frequency of said oscillator, and means connected between the output side of said frequency discriminator-detector and said common output circuit for preventing the application of said first output voltage to said output circuit unless such output voltage is above a predetermined value.

2. In a frequency control system for an oscillator, means for mixing a portion of the output of said oscillator with a selected stabilized harmonic frequency wave to produce a first beat frequency wave, a variable frequency source continuously adjustable over a frequency range equal to the frequency difference between adjacent harmonic frequencies, means for mixing the output of said last-named oscillator with said first beat frequency wave to produce a second beat frequency wave of predetermined nominal value, a tuned frequency discriminator-detector tuned to said nominal value and adapted to develop an output voltage proportional to deviations of said second beat frequency wave from said nominal value, means supplying said second beat frequency wave to the input of said discriminator-detector, a phase detector having two inputs and adapted to develop an output voltage proportional to phase differences between the two inputs thereto, means supplying said second beat frequency wave to said phase detector as one of the inputs therefor, means supplying a stabilized wave of said nominal value to said phase detector as the other input therefor, a common output circuit receptive of both of said output voltages for controlling the frequency of said first-named oscillator, and means connected between the output side of said frequency discriminator-detector and said common output circuit for preventing the application of said first-mentioned output voltage to said output circuit unless such output voltage is above a predetermined value.

3. In a frequency control system for an oscillator, means for mixing a wave representative of the output of said oscillator with a stable frequency wave to produce a beat frequency wave of predetermined nominal value, a tuned frequency discriminator-detector tuned to said nominal value, means supplying said beat frequency wave to the input of said discriminator-detector, a phase detector having two inputs, means supplying said beat frequency wave to said phase detector as one of the inputs therefor, means supplying a stabilized wave of said nominal value to said phase detector as the other input therefor, a diode connected between the output of said frequency discriminator-detector and a terminal, a diode connected between the output of said phase detector and said terminal, said diodes having their like electrodes connected to said terminal, and a common output circuit coupled to said terminal.

4. In a frequency control ssytem for an oscillator, means for mixing a wave representative of the output of said oscillator with a stable frequency wave to produce a beat frequency wave of predetermined nominal value, a tuned frequency discriminator-detector tuned to said nomimal value, means supplying said beat frequency wave to the input of said discriminator-detector, a phase detector having two inputs, means supplying said beat frequency wave to said phase detector as one of the inputs therefor, means supplying a stabilized wave of said nominal value to said phase detector as the other input therefor, a first diode connected between the output of said frequency discriminator-detector and a first terminal, a second oppositely-poled diode connected between the output of said frequency discriminator-detector and a second terminal, a third diode connected between the output of said phase detector and said first terminal, said first and third diodes having their like electrodes connected to said first terminal, a fourth diode poled oppositely from said third diode connected between the output of said phase detector and said second terminal, said second and fourth diodes having their like electrodes connected to said second terminal, and separate output circuits having a portion thereof in common, coupled to said first and second terminals.

5. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, a diode arranged as a switch between the output side of said frequency discriminator-detector and said common output circuit, and means for biasing said diode to conduct only in response to voltages above a predetermined value applied thereto.

6. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, means connected between the output side of said frequency discriminator-detector and said common output circuit for preventing the application of said first output voltage to said output circuit unless such output voltage is above a predetermined value, and a diode arranged as a switch between the output side of said phase detector and said common output circuit.

7. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, said common output circuit comprising a pair of tubes having separate input circuits and a common output circuit; two diodes one arranged as a switch between the output side of said frequency discriminator-detector and the input circuit of each respective tube, and means for biasing said diodes to conduct only in response to voltages above a predetermined value applied thereto.

8. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, said common output circuit comprising a pair of tubes having separate input circuits and a common output circuit; two oppositely-poled diodes one arranged as a switch between the output side of said frequency discriminator-detector and the input circuit of each respective tube, and means for biasing said diodes to conduct only in response to voltages above a predetermined value applied thereto.

9. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase difference between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, said common output circuit comprising a pair of tubes having separate input circuits and a common output circuit; means connected between the output side of said frequency discriminator-detector and the common output circuit of said tubes for preventing the application of said first output voltage to said output circuit unless such output voltage is above a predetermined value, and two diodes one arranged as a switch between the output side of said phase detector and the input circuit of each respective tube.

10. In a frequency control system for an oscillator, means for mixing a wave representative of the output of said oscillator with a stable frequency wave to produce a beat frequency wave of predetermined nominal value, a tuned frequency discriminator-detector tuned to said nominal value and adapted to develop a first output voltage proportional to deviations of said beat frequency wave from said nominal value, means supplying said beat frequency wave to the input of said discriminator-detector, a phase detector having two inputs and adapted to develop a second output voltage proportional to phase differences between the two inputs thereto, means supplying said beat frequency wave to said phase detector as one of the inputs therefor, means supplying a stabilized wave of said nominal value to said phase detector as the other input therefor, a common output circuit receptive of both of said output voltages for controlling the frequency of said oscillator, said common output circuit comprising a pair of tubes having separate input circuits and a common output circuit; two diodes one arranged as a switch between the output side of said phase detector and the input circuit of each respective tube, two diodes one arranged as a switch between the output side of said frequency discriminator-detector and the input circuit of each respective tube, and means for biasing said last-mentioned two diodes to conduct only in response to voltages above a predetermined value applied thereto.

11. In a frequency control system for an oscillator, means for mixing a portion of the output of said oscillator with a selected stabilized harmonic frequency wave to produce a first beat frequency wave, a variable frequency source continuously adjustable over a frequency range equal to the frequency difference between adjacent harmonic frequencies, means for mixing the output of said last-named oscillator with said first beat frequency wave to produce a second beat frequency wave of predetermined nominal value, a tuned frequency discriminator-detector tuned to said nominal value and adapted to develop an output voltage proportional to deviations of said second beat frequency wave from said nominal value, means supplying said second beat frequency wave to the input of said discriminator-detector, a phase detector having two inputs and adapted to develop an output voltage proportional to phase differences between the two inputs thereto, means supplying said second beat frequency wave to said phase detector as one of the inputs therefor, means supplying a stabilized wave of said nominal value to said phase detector as the other input therefor, a common output circuit receptive of both of said output voltages for controlling the frequency of said first-named oscillator, a diode arranged as a switch between the output side of said frequency discriminator-detector and said common output circuit, and means for biasing said diode to conduct only in response to voltages above a predetermined value applied thereto.

12. In a frequency control system for an oscillator, means for mixing a portion of the output of said oscillator with a selected stabilized harmonic frequency wave to produce a first beat frequency wave, a variable frequency source continuously adjustable over a frequency range equal to the frequency difference between adjacent harmonic frequencies, means for mixing the output of said last-named oscillator with said first beat frequency wave to produce a second beat frequency wave of predetermined nominal value, a tuned frequency discriminator-detector tuned to said nominal value and adapted to develop an output voltage proportional to deviations of said second beat frequency wave from said nominal value, means supplying said second beat frequency wave to the input of said discriminator-detector, a phase detector having two inputs and adapted to develop an output voltage proportional to phase differences between the two inputs thereto, means supplying said second beat frequency wave to said phase detector as one of the inputs therefor, means supplying a stabilized wave of said nominal value to said phase detector as the other input therefor, a common output circuit receptive of both of said output voltages for controlling the frequency of said first-named oscillator, means connected between the output side of said frequency discriminator-detector and said common output circuit for preventing the application of said first output voltage to said output circuit unless such output voltage is above a predetermined value, and a diode arranged as a switch between the output side of said phase detector and said common output circuit.

13. In a frequency control system for an oscillator, means for mixing a portion of the output of said oscillator with a selected stabilized harmonic frequency wave to produce a first beat frequency wave, a variable frequency source continuously adjustable over a frequency range equal to the frequency difference between adjacent harmonic frequencies, means for mixing the output of said last-named oscillator with said first beat frequency wave to produce a second beat frequency wave of predetermined nominal value, a tuned frequency discriminator-detector tuned to said nominal value and adapted to develop an output voltage proportional to deviations of said second beat frequency wave from said nominal value, means supplying said second beat frequency wave to the input of said discriminator-detector, a phase detector having two inputs and adapted to develop an output voltage proportional to phase differences between the two inputs thereto, means supplying said second beat frequency wave to said phase detector as one of the inputs therefor, means supplying a stabilized wave of said nominal value to said phase detector as the other input therefor, a common output circuit receptive of both of said output voltages for controlling the frequency of said first-named oscillator, said common output circuit comprising a pair of tubes having separate input circuits and a common output circuit; two diodes one arranged as a switch between the output side of said frequency discriminator-detector and the input circuit of each respective tube, and means for biasing said diodes to conduct only in response to voltages above a predetermined value applied thereto.

14. In a frequency control system for an oscillator, means for mixing a portion of the output of said oscillator with a selected stabilized harmonic frequency wave to produce a first beat frequency wave, a variable frequency source continuously adjustable over a frequency range equal to the frequency difference between adjacent harmonic frequencies, means for mixing the output of said last-named oscillator with said first beat frequency wave to produce a second beat frequency wave of predetermined nominal value, a tuned frequency discriminator-detector tuned to said nominal value and adapted to develop an output voltage proportional to deviations of said second beat frequency wave from said nominal value, means supplying said second beat frequency wave to the input of said discriminator-detector, a phase detector having two inputs and adapted to develop an output voltage proportional to phase differences between the two inputs thereto, means supplying said second beat frequency wave to said phase detector as one of the inputs therefor, means supplying a stabilized wave of said nominal value to said phase detector as the other input therefor, a common output circuit receptive of both of said output voltages for controlling the frequency of said first-named oscillator, said common output circuit comprising a pair of tubes having separate input circuits and a common output circuit; two diodes one arranged as a switch between the output side of said phase detector and the input circuit of each respective tube, two diodes one arranged as a switch between the output side of said frequency discriminator-detector and the input circuit of each respective tube, and means for biasing said last-mentioned two diodes to conduct only in response to voltages above a predetermined value applied thereto.

References Cited in the file of this patent

UNITED STATES PATENTS

| | | |
|---|---|---|
| 2,354,827 | Peterson | Aug. 1, 1944 |
| 2,541,454 | White et al. | Feb. 13, 1951 |
| 2,568,412 | Robinson | Sept. 18, 1951 |
| 2,581,594 | MacSorley | Jan. 8, 1952 |
| 2,610,297 | Leed | Sept. 9, 1952 |
| 2,685,032 | Cox | July 27, 1954 |